United States Patent [19]

Arai

[11] 3,953,765
[45] Apr. 27, 1976

[54] VERTICAL DEFLECTION CIRCUIT
[75] Inventor: Takeshi Arai, Higashiosaka, Japan
[73] Assignee: Sanyo Electric Co., Ltd., Osaka, Japan
[22] Filed: Nov. 12, 1973
[21] Appl. No.: 414,792

[30] Foreign Application Priority Data
  Nov. 11, 1972  Japan............................ 47-113372
  Nov. 11, 1972  Japan............................ 47-113373

[52] U.S. Cl.............................. 315/389; 315/403; 315/387
[51] Int. Cl.²..................... H01J 29/70; H01J 29/72
[58] Field of Search.......... 315/27 TD, 28, 29, 388, 315/389, 399, 403, 408, 409, 410, 387

[56] References Cited
UNITED STATES PATENTS
3,774,069  11/1973  Yasumatsuya................. 315/27 TD Primary Examiner—T. H. Tubbesing
Assistant Examiner—T. M. Blum
Attorney, Agent, or Firm—Armstrong, Nikaido & Wegner

[57] ABSTRACT

A vertical deflection circuit for use in a television receiver, comprising a control circuit for stabilizing the width of a pulse either in a vertical oscillator circuit or between a vertical oscillator circuit and vertical output circuit to thereby stabilize the width of a pulse component included in the vertical deflection output signal.

6 Claims, 13 Drawing Figures

VERTICAL DEFLECTION CIRCUIT

BACKGROUND OF THE INVENTION

The present invention relates to a vertical deflection circuit for use in a television receiver and, more particularly, to a vertical deflection circuit of a type wherein no vertical output transformer is employed. This type of vertical deflection circuit with no output transformer is generally referred to as an OTL (Output Transformerless) type vertical deflection circuit.

It is known that variation of the pulse width of the flyback pulse produced in a vertical output stage of the vertical deflection circuit is the cause in the raster on the television picture tube, of a white bar, flicker, jitter, line crowding and/or other raster disorders. In addition thereto, in the vertical deflection output circuit where the output stage is composed of a single-ended push-pull amplifier having a vertical output transistor, an excessive load is often imposed on the output transistor and, in an extreme case, the output transistor is destroyed.

One of the major causes for variation of the vertical flyback pulse width is interference by horizontal flyback pulses from the horizontal deflection circuit, in which case sufficient interlaced scanning can not be performed.

In order to avoid these inconveniences, the vertical flyback pulse width must be controlled at a constant width. However, by the reason as will be described with reference to FIG. 1, a prior art vertical deflection circuit in a television receiver fails to satisfy this requirement.

Figures 1, 2:
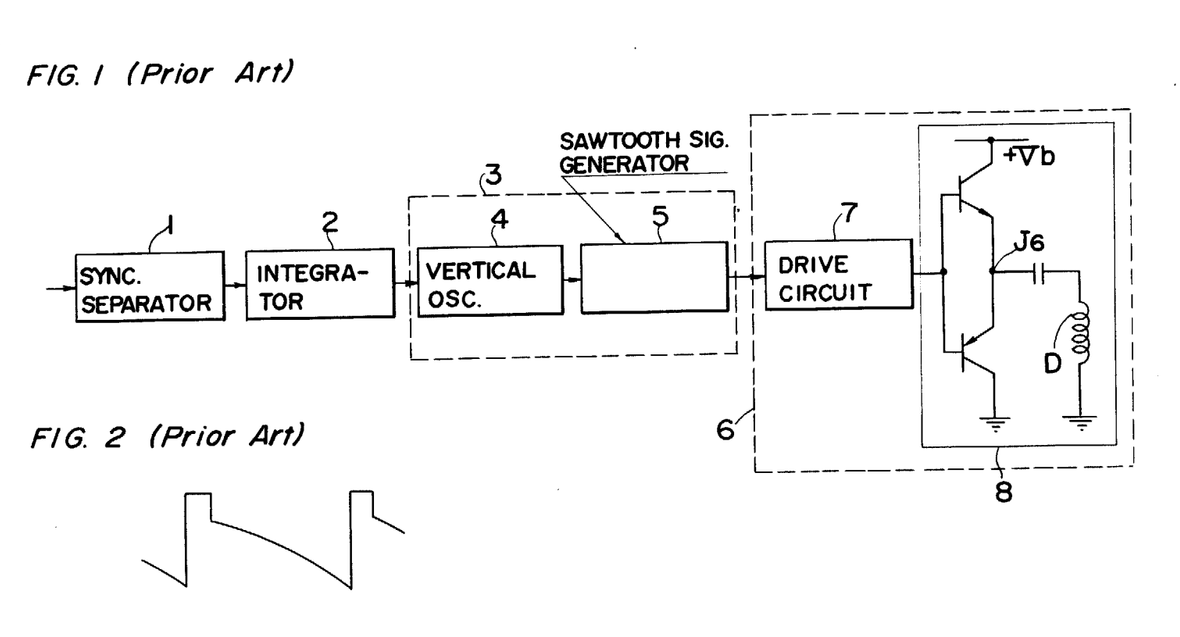
FIG. 1 is a block diagram showing the prior art vertical deflection circuit.
FIG. 2 is a diagram showing the waveform of vertical deflection output produced in the prior art vertical deflection circuit.

Referring now to FIG. 1 wherein a prior art vertical deflection circuit now under discussion is shown, a circuit arrangement is such that synchronizing pulses emerging from a sync separator 1 are, after having its waveform shaped in an integrator 2, applied to a vertical oscillating circuit 3 which includes a vertical oscillator 4 and a sawtooth deflecting signal generator 5. The vertical oscillator 4 upon receipt of the shaped sync pulses from the integrator 2 is driven to generate a train of pulses synchronized with the vertical synchronizing signal which are subsequently fed to the sawtooth deflecting signal generator 5. The waveform of a sawtooth deflecting signal emerging from the generator 5 is shown in FIG. 2 and this deflecting signal is transferred from the generator 5 to a vertical deflection output circuit 6 which includes a drive circuit 7 for amplifying the sawtooth deflecting signal upon receipt thereof from the generator 5 and a vertical output stage 8 having a vertical deflection coil D.

As shown in FIG. 2, the sawtooth deflecting signal includes rectangular component pulses and the waveform of an output signal from the vertical output stage 8 which is similar to that of the sawtooth deflecting signal. The portions of the output signal from the vertical output stage 8, which correspond to the rectangular component pulses of the sawtooth deflecting signal are known as flyback pulses.

In the vertical deflection circuit of the above arrangement, the pulse width of the flyback pulses included in the output of the vertical output stage 8 is affected by the pulse width of the rectangular component pulses fed from the oscillator 4 to the output stage 8. More specifically, in the OTL type vertical deflection circuit, since there is no inductance element, such as a vertical output transformer, that determines the pulse width of the flyback pulse, the pulse width of the flyback pulse is mostly determined by the pulse width of the corresponding rectangular component pulse of the sawtooth deflecting signal applied to the output stage 8. Accordingly, variation of the pulse width of the rectangular component pulses produced in the oscillator 4 results in variation of the pulse width of the flyback pulses produced in the output stage 8.

This inconvenience is likely to be avoided if the pulse width of the output pulse from the oscillator 4 is stabilized. However, this stabilization of the pulse width of the output pulse from the oscillator 4 cannot be achieved without difficulties by the following reason.

In the vertical oscillator 4, the start of each output pulse from this oscillator 4 can be accurately determined by the vertical synchronizing signal applied thereto. On the contrary thereto, the time at which the output pulse from the oscillator 4 terminates is solely determined by operational characteristics of the oscillator 4 itself and, therefore, is often adversely affected by and in the presence of external noises. Once the oscillator 4 is adversely affected by and in the presence of the external noises, the duration between the start and termination of the output pulse from said oscillator, that is, the pulse width, varies and, therefore, the problem remains still unsolved.

SUMMARY OF THE INVENTION

Accordingly, an essential object of the present invention is to provide a vertical deflection circuit for use in a television receiver, which substantially eliminates the inconveniences inherent in the conventional circuit of a similar kind and which effectively stabilizes the pulse width of flyback pulses included in a vertical deflection output signal.

Another important object of the present invention is to provide a vertical deflection circuit of the type referred to above, wherein a pulse width control is provided between the vertical oscillator and the vertical output circuit for controlling the pulse width of the output pulses from the oscillator.

A further important object of the present invention is to provide a vertical deflection circuit of the type referred to above, wherein a feedback loop is provided to control the operation of the pulse width control in response to an output signal emerging from the vertical output stage.

A still further important object of the present invention is to provide a vertical deflection circuit of the type referred to above, wherein a feedback loop is provided to control the oscillator in response to an output signal emerging from the vertical output stage for stabilizing the pulse width of the flyback pulses produced in the vertical output stage.

These and other objects and features of the present invention will become clear from the following description taken in conjunction with preferred embodiments of the present invention with reference to the accompanying drawings in which;

BRIEF DESCRIPTION OF THE DRAWINGS

Before the description of the present invention proceeds, it should be noted that like parts are designated by like reference numerals throughout the accompanying drawings for the sake of brevity.

DESCRIPTION OF THE PREFERRED EMBODIMENTS

Figure 3:
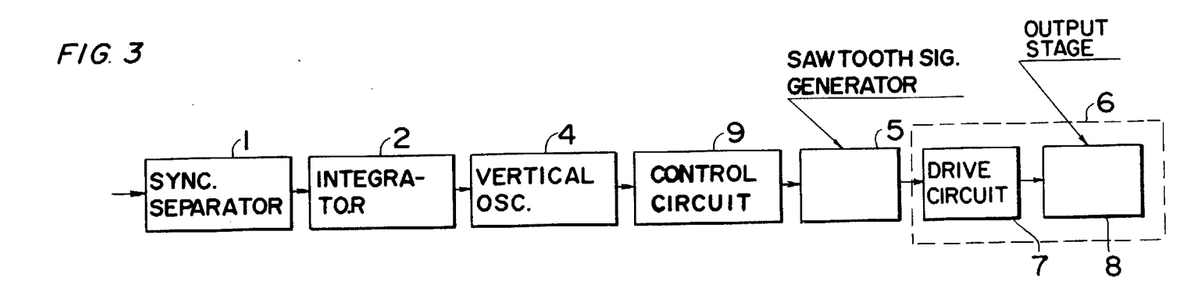
FIG. 3 is a block diagram showing one embodiment of the vertical deflection circuit according to the present invention.

Referring now to FIG. 3, between the vertical oscillator 4 and the sawtooth deflecting signal generator 5, there is provided a pulse width control circuit 9 for stabilizing the pulse width of pulses fed to the sawtooth deflecting signal generator 5 from the vertical oscillator 4.

Figure 4:
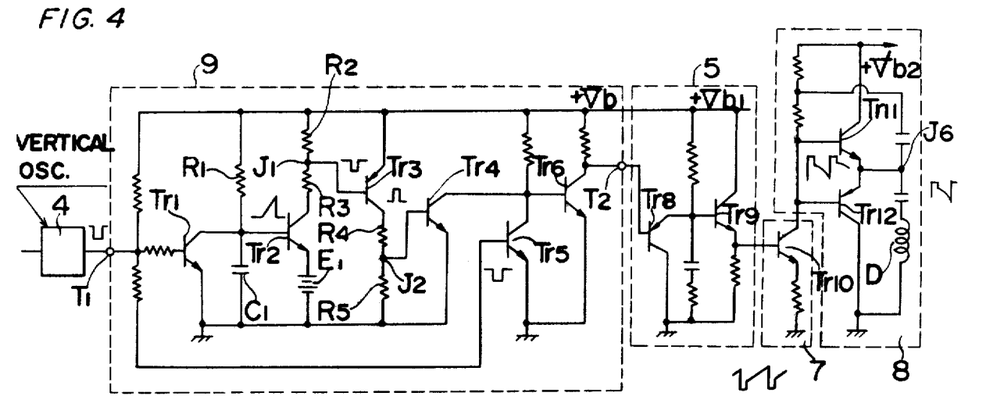
FIG. 4 is a circuit diagram showing the details of the vertical deflection circuit shown in FIG. 3.

FIG. 4 shows details of the pulse width control circuit 9, which will now be described.

Assuming that a pulse of unstable pulse width is applied from the vertical oscillator 4 to the input terminal T1 of the pulse width control circuit 9, which is in turn applied to the base of a switching transistor Tr1, the latter is triggered on to cause the capacitor C1 to discharge. In other words, when the pulse is applied to the pulse width control circuit 9 from the oscillator 4, that is, when the switching transistor Tr1 is non-conductive, voltage from the D-C power source Vb, after having passed through the resistor of sufficiently high resistance, charges the capacitor C1. However, the charge stored in the capacitor C1 is discharged to the ground through the collector-emitter of the switching transistor Tr1 when the latter starts conducting.

Figure 5:
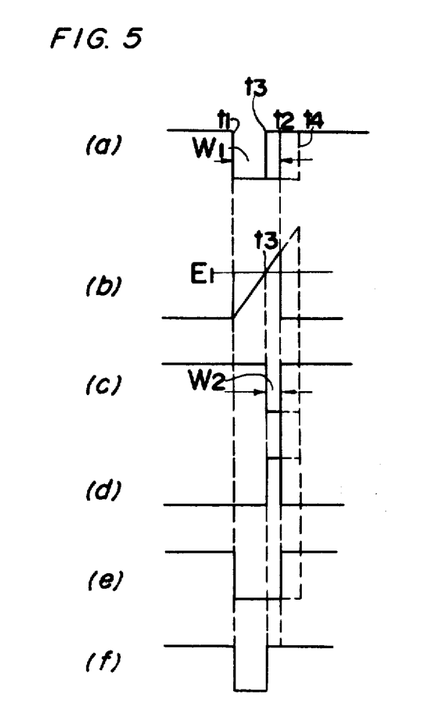
FIG. 5 is a diagram showing waveforms of various signals obtainable at various portions of the circuit of FIG. 4.

As a result, in the capacitor C1, voltage of sawtooth waveform as shown by the solid line in FIG. 5(b) is generated across said capacitor C1, which is subsequently applied to the base of a switching transistor Tr2. The latter transistor Tr2 starts conducting only when the voltage thus applied to the base thereof exceeds a D-C power source voltage E1 applied to the emitter of said transistor Tr2. Conduction of the switching transistor Tr2 results in a pulsating voltage of rectangular waveform, as shown by the solid line in FIG. 5(c), appearing at the common junction J1 of resistors R2 and R3, both of which are loaded on the collector of the transistor Tr2, due to the saturation characteristic of the transistor Tr2. The pulsating voltage at the common junction J1 is fed to the base of an amplifying transistor Tr3 so that the pulsating voltage is thereby amplified and phase-reversed and, as a result thereof, a phase-reversed pulsating voltage of the waveform as shown by the solid line in FIG. 5(d) appears at the common junction J2 of resistors R4 and R5, both of which are loaded on the collector of the transistor Tr3. This pulsating voltage at the common junction J2 is further phase-reversed by an amplifying transistor Tr4. Therefore, a voltage received by the transistor Tr6 from the collector of the amplifying transistor Tr4 has a waveform similar to that of the pulsating voltage applied to the base of the amplifying transistor Tr3.

Simultaneously, the output pulse at the input terminal T1 is also applied to the base of a transistor Tr5. The transistor Tr5 acts to phase-reverse the output pulse to produce a pulsating voltage of a waveform as shown by the solid line in FIG. 5(e) at the collector of said transistor Tr5. The collector of this transistor Tr5 is connected with the collector of the transistor Tr4, which is in turn connected to the base of the transistor Tr6. This transistor Tr5 is non-conductive when voltage applied to the base threof is zero, in which condition the base of the transistor Tr6 receives a pulse of positive potential, i.e., a high level pulse, whereby it is held in a conductive state with the collector thereof in a zero volt or low level state. If the high level pulse is applied to the base of the transistor Tr4, this high level pulse is amplified and phasereversed by the transistor Tr4 to produce a low level pulse from the collector thereof which is in turn fed to the transistor Tr6 to trigger the latter off. When the transistor Tr6 is thus triggered off, a high level voltage is produced from the collector of the transistor Tr6.

In view of the foregoing, it can be seen that these transistors Tr4, Tr5 and Tr6 cooperate with each other to substantially act as a gating circuit while the pulsating voltage applied to the base of the transistor Tr6 from the transistor Tr4 acts as a trigger pulse. Accordingly, it is clear that the pulse appearing at the collector of the transistor Tr6 has a pulse width, as shown in FIG. 5(f), which corresponds to the pulse width W1 of the output pulse at the input terminal T1 extracted by the pulse width W2 of the high level pulse applied to the base of the transistor Tr4.

As stated hereinbefore, the start of the output pulse from the oscillator 4 can be accurately fixed while it is difficult to fix the termination of the pulse. Assuming, therefore, that the output pulse shown by the broken line in FIG. 5(a) and having a pulse width t1 to t4 which is larger than the desired pulse width t1 to t2 as shown by the solid line in FIG. 5(a), is applied to the pulse width control circuit 9 from the vertical oscillator 4, the transistor Tr1 becomes non-conductive and the voltage across the capacitor C1 accordingly increases as shown by the broken line in FIG. 5(b). On the other hand, the transistor Tr5 becomes non-conductive upon receiving of the input pulse at the base thereof at the time t1, causing the transistor Tr6 to start conducting.

When the voltage at the base of the transistor Tr2 exceeds the emitter voltage defined by the source E1, the transistors Tr2 and Tr3 become conductive and the junction point J2 becomes high level at the time t3 as shown in FIG. 5(d). Accordingly, the collector of the transistor Tr4 becomes low level causing the transistor Tr6 to become non-conductive whereby the collector of the transistor Tr6 becomes high level at the time t3.

From the foregoing, it is clear that, even if the width of the input pulse applied to the pulse width control circuit 9 is larger than the desired or predetermined width, the width output pulse of the control circuit 9 can be defined at the predetermined width as shown in FIG. 5(f).

Accordingly, a rectangular pulse having a predetermined pulse width is applied to the base of the input transistor Tr8 of the sawtooth signal generator 5, whereby the width of the flyback pulses included in the vertical deflection output can be maintained at the desired or predetermined width.

In the embodiment of FIG. 3, the pulse width of the output pulse of the pulse width control circuit 9 may not be suitable for the vertical output circuit. In this case, equalization of the pulse width can be achieved by varying the D-C voltage E1 supplied to the emitter of the transistor Tr2. Specifically, if the voltage E1 increases or decreases the pulse width at the output terminal F of the control circuit 9 is reduced or enlarged, respectively.

Figure 6:
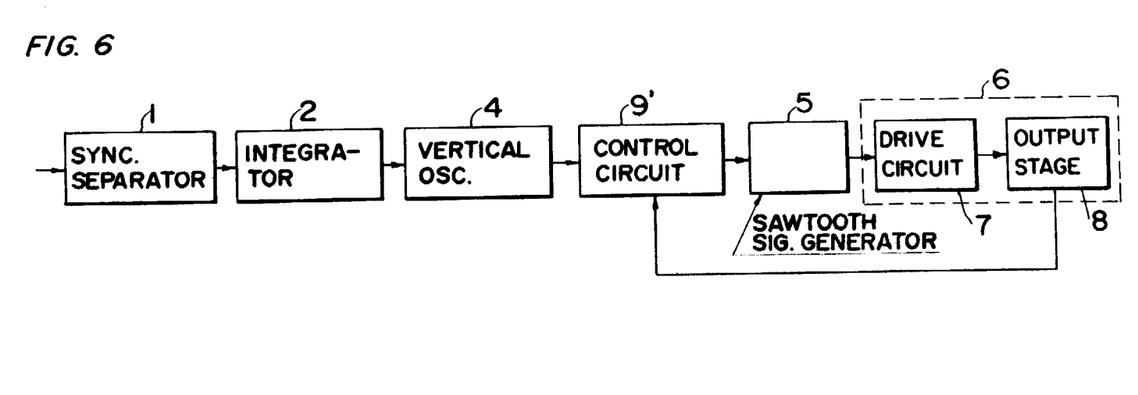
FIG. 6 is a block diagram showing another embodiment of the vertical deflction circuit according to the present invention.

FIG. 6 shows another embodiment of the present invention in which the pulse width control circuit 9' receives a feedback signal from the deflection output circuit 8 so that the pulse width of the output signal from the width control circuit 9' can be advantageously controlled to maintain the width of the flyback pulse constant.

Figure 7:
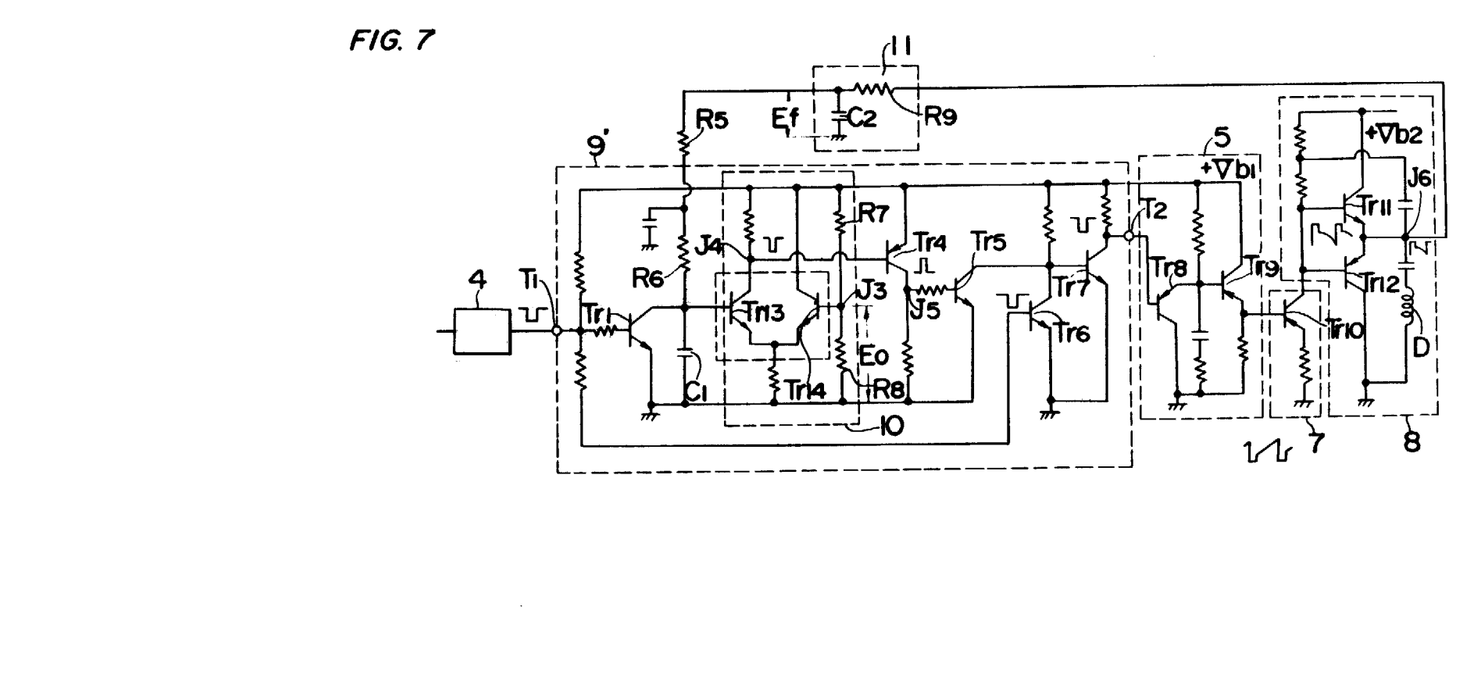
FIG. 7 is a circuit diagram showing the details of the vertical deflection circuit shown in FIG. 6.

FIG. 7 shows the details of the width control circuit 9'. Referring now to FIG. 7, there is provided a differential amplifier 10 composed of transistors Tr13 and Tr14. The base of the transistor Tr13 receives the voltage on the capacitor C1 and feedback voltage fed back from the common junction J6 of the deflection output circuit through the integrator 11 and the resistors R5 and R6.

The collector of the transistor Tr13 is connected to the base of the transistor Tr4 which constitutes the gating circuit in cooperation with the transistors Tr5 and Tr6. The switching level of the transistor Tr13 is defined by base voltage Eo appearing at the junction point J3 of the resistors R7 and R8.

Operation of the circuit arrangement of FIGS. 6 and 7 will now be described.

Figure 8:
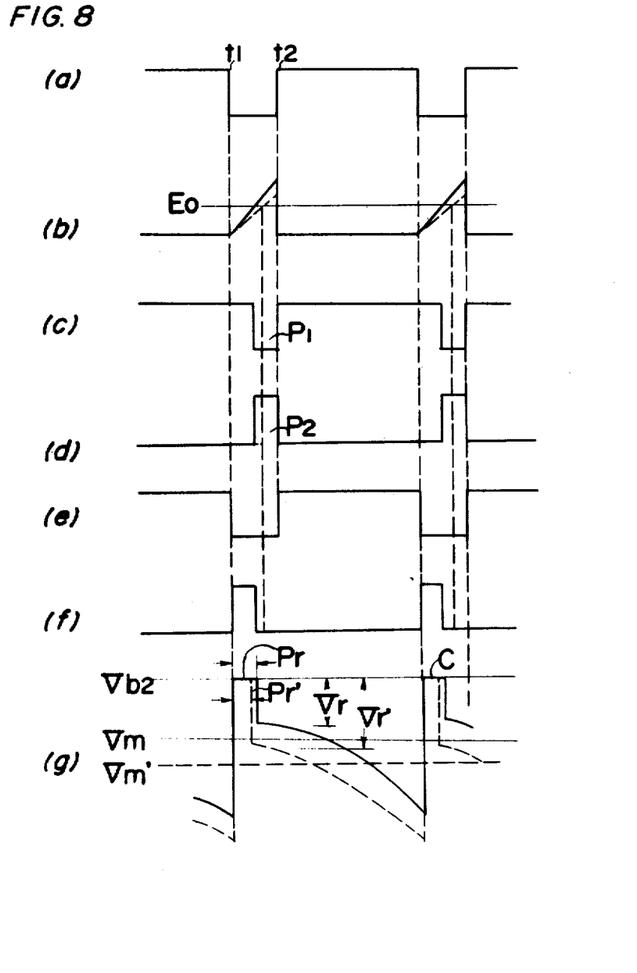
FIG. 8 is a diagram showing waveforms of various signals obtainable at various portions of the circuit of FIG. 7.

It is assumed that, during operation of the control circuit 9' with the transistor Tr1 triggered off by the application of the low level pulse from the vertical oscillator 4, voltage supplied from the integrator 11 through the constant current resistor R5 and then a time constant adjusting resistor R6 charges the capacitor C1. Voltage of a sawtooth waveform as shown by the solid line in FIG. 8(b) is generated across the capacitor C1. This sawtooth voltage is subsequently fed to the differential amplifier 10. The charging speed of the capacitor C1 is defined by the voltage $E_f$ of the integrator 11.

When the voltage at the base of the transistor Tr13 exceeds the voltage Eo appearing at the base of the transistor Tr14, the transistor Tr13 becomes conductive with the output of the transistor Tr13 becoming low level. At the end of the input pulse, transistor Tr1 becomes conductive, the capacitor C1 is discharged, whereby the transistor Tr13 becomes non-conductive causing the output of the transistor Tr13 to become high level.

Therefore, pulses of rectangular waveform as shown by the solid line in FIG. 8(c) can be generated from the collector of the transistor Tr13. The pulses from the transistor Tr13 are amplified and phase-reversed by the transistor Tr4, which are in turn applied to the base of the transistor Tr7 through the transistor Tr5. It should be noted that the waveform of pulse at the junction J5 between the transistors Tr4 and Tr5 is shown by the solid lines in FIG. 8(d).

Simultaneously, the pulses from the input terminal T1 are also applied to the base of the transistor Tr6. Consequently, in a similar manner as in the circuit arrangement of FIG. 4, pulses of a waveform as shown by the solid line in FIG. 8(f) can be obtained at the collector of the transistor Tr7 and, hence, at the output terminal T2 of the width control circuit 9'.

The output pulses from the width control circuit 9' are supplied to the base of the transistor Tr9 through the transistor Tr8, said transistors Tr8 and Tr9 forming the sawtooth signal generator 5. Output from the sawtooth signal generator 5 is then applied to the base of the transistor Tr10 in the form of sawtooth pulses as shown, thereby causing the transistor Tr10 to generate trigger pulse for driving the vertical output transistors Tr11 and Tr12 in the known manner. The result is that vertical deflection output of a waveform as shown by the solid line in FIG. 8(g) appears at the junction J6 from which it is applied in part to the vertical deflection coil D and in part to the resistor R5 through the feedback loop. The deflection output that has been fed through the feedback loop is, prior to application thereof to the resistor R5, smoothed by the integrator 11 which is composed of the resistor R9 and the capacitor C2, to obtain a control voltage Ef of a suitably divided value.

Assuming that the pulse width Pr of flyback pulses included in the vertical deflection output from the vertical output stage 8 varies, for example, gets smaller and is at a value Pr', the voltage Vr of the flyback pulse accordingly increases by the reason of the following equation:

$$Vr = K \frac{L \cdot i}{Pr} \qquad (1)$$

wherein L is inductance of the vertical deflection coil D, i is vertical deflection current and K is a constant. In other words, while the peak level C of the flyback pulse is determined by the D-C power source voltage Vb2 and, therefore, does not vary, the average D-C voltage level Vm of the vertical deflection output is lowered to read a value Vm' as shown in FIG. 8(g).

Consequently, the pulse width control voltage Ef applied to the resistor R5 through the integrator 11 is lowered and the voltage to which the capacitor C1 is charged is also lowered. The result is such that, as indicated by the broken line in FIG. 8(b), the charging speed of the capacitor C1 is retarded whereby conduction of the transistor Tr13 is delayed. Accordingly, the waveforms of the pulses P1 and P2 at the junctions J4 and J5 are respectively narrowed as shown by the broken lines in FIG. 8(c) and (d). As a result thereof, the pulse width of the output pulse appearing at the output terminal T2 of the width control circuit 9' is broadened as shown by the broken line in FIG. 8(f) since the width of the pulse appearing at the terminal T2 is defined by a difference between the pulse at the base of the transistor Tr6 and the pulse at the base of the transistor Tr5. Therefore, the variation of the pulse width Pr of the vertical flyback pulse can be advantageously and effectively compensated for.

Figure 9:
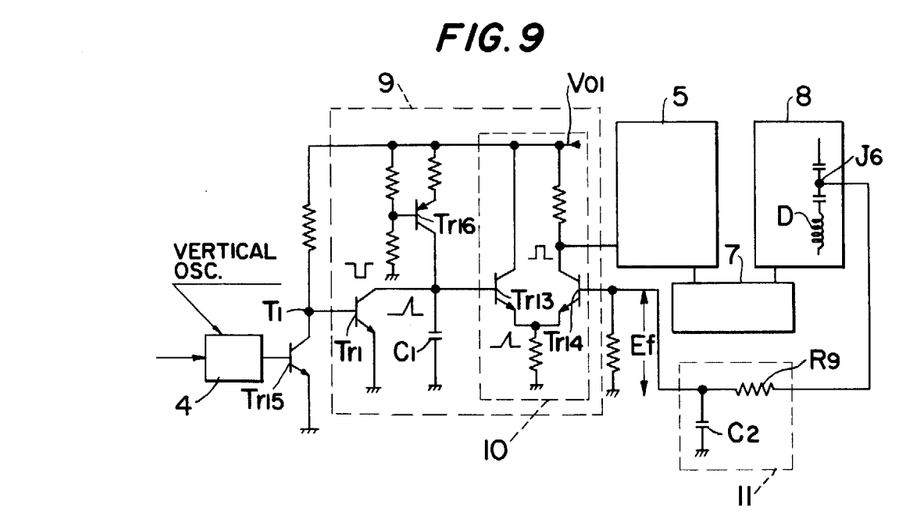
FIG. 9 is a circuit diagram showing a further embodiment of the vertical deflection circuit according to the present invention.
Figure 10:
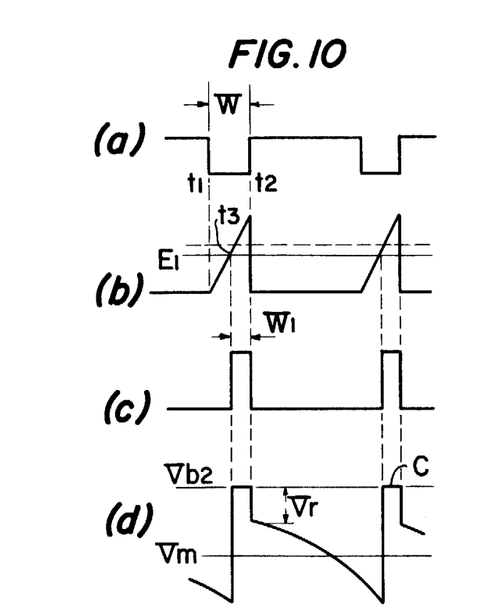
FIG. 10 is a diagram showing waveforms of various signals obtainable at various portions of the circuit of FIG. 9.

FIG. 9 shows a further embodiment of the present invention. In the circuit arrangement of FIG. 9, the output from the oscillator 4 is first applied to the amplifying transistor Tr15 by which it is amplified and phase-reversed. From this transistor Tr15, the pulse of a waveform as shown in FIG. 10(a) is applied to the base of the transistor Pr1, thereby causing the latter to be triggered on. During a period in which the transistor Tr1 is non-conductive, the capacitor C1 is charged through the constant current transistor Tr16 and, when the transistor Tr1 starts conducting upon receipt of the pulse from the transistor Tr15, voltage charged in the capacitor C1 is discharged through the collector-emitter of the transistor Tr1. By this operation, voltage of the sawtooth waveform as shown in FIG. 10(b) is generated across the capacitor C1. This sawtooth voltage is subsequently applied to a differential amplifier 10 composed of a pair of transistors Tr13 and Tr14. The transistor Tr14 receives control voltage Ef fed from the junction point J6 of the vertical deflection output stage 8 through the integrator 11. By the level Ef of voltage fed to the base of the transistor Tr14, the slicing level of this sawtooth voltage can be varied and, hence, the pulse width of the pulse emerging from the collector of the transistor Tr14 can be varied as indicated by W1 in FIG. 10(c). The output pulse from the collector of the transistor Tr14 is fed to the base of the transistor Tr10 of the drive circuit 7 through the sawtooth signal generator 5. The vertical deflection output of a waveform as shown in FIG. 10(d) is generated at the junction J6 of the vertical output stage 8 after the output transistors Tr11 and Tr12 are driven by drive signal from the drive circuit 7.

Assuming now that the pulse width W of the output from the oscillator 4 is suitably selected such as to be larger than that required in the vertical deflection output from the output stage 8, if the flyback pulse width Tr of the vertical deflection output becomes larger than the pulse width W, the voltage Vr of the flyback pulse is reduced for the same reason as in the embodiment of FIG. 7 while the peak level C thereof remains the same and, accordingly, the average D-C voltage Vm increases, resulting in increase of the control voltage Ef to be applied to the base of the transistor Tr14.

Therefore, the slicing level of the sawtooth voltage determined by the differential amplifier increases as indicated by the broken line in FIG. 10(b) and the pulse width of the output pulse emerging from the collector of the transistor Tr14 is reduced.

In this way, variation of the output pulse from the oscillator 4 resulting from the variation of the oscillator 4 itself can be advantageously and adequately compensated for by the control circuit 9' and the average D-C voltage Vm of output from the output stage 8 and the flyback pulse of the vertical deflection output are respectively controlled to assume a predetermined value.

Figure 11:
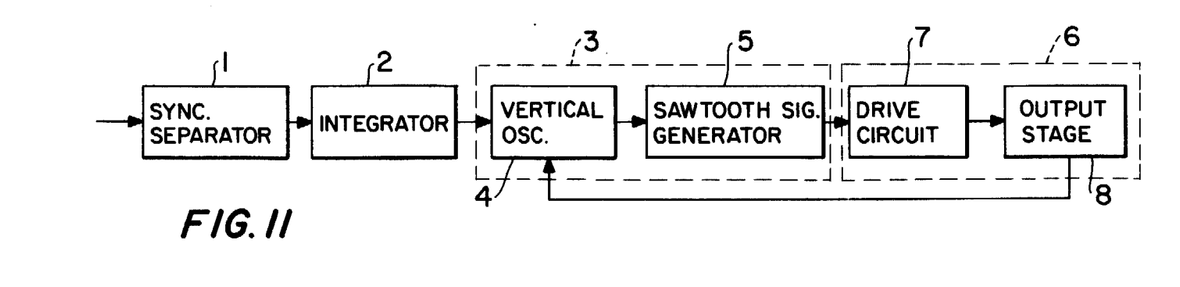
FIG. 11 is a block diagram showing a still further embodiment of the vertical deflection circuit according to the present invention.

FIG. 11 shows a still further embodiment of the present invention in which feedback voltage fed from the vertical output stage 8 is applied to the vertical oscillator 4 to maintain the width of the output pulse of the vertical oscillator 4 at a constant value.

Figure 12:
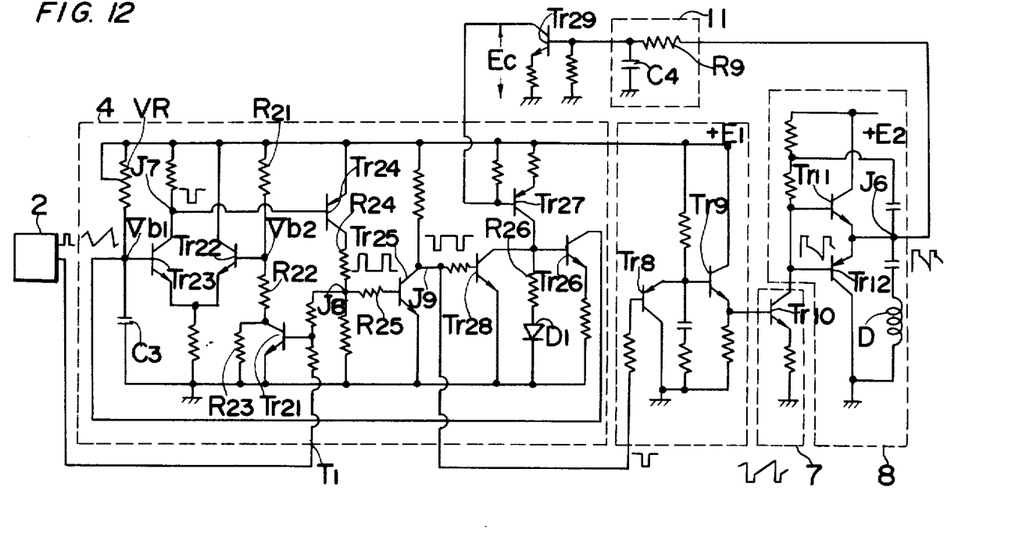
FIG. 12 is a circuit diagram showing the details of the vertical deflection circuit shown in FIG. 11.

The detailed circuit of the vertical oscillator 4 is shown in FIG. 12.

Referring to FIG. 12, the output pulse of the integrator 2 is applied to a base of a transistor Tr21 the collector of which is connected to the base of a transistor Tr22 through a resistor R21. The transistor Tr22 constitutes the differential amplifier in cooperation with a transistor Tr23 the base of which is connected to a capacitor C3 receiving voltage E1 of the D-C power source through a variable resistor VR.

The collector of the transistor Tr23 is connected to the base of an amplifying transistor Tr24 of which the collector is connected to the base of a transistor Tr25 through resistors R24 and R25. The collector of the transistor Tr25 is applied to the base of a transistor Tr26 and collector of a transistor Tr27 through a transistor Tr28. The junction point of the collector Tr27 and the base of the transistor Tr26 is grounded through a resistor R26 and a diode D1. The transistor Tr27 operates as a current stabilizer which is controlled by the collector output of the transistor Tr29. The transistor Tr27 receives control voltage Ec which is fed from the integrator 11 through a transistor Tr29. The collector output of the transistor Tr25 is applied to the base of the transistor Tr8 in the sawtooth signal generator 5.

Operation of the vertical deflection circuit shown in FIG. 12 will now be described.

Assuming that a main switch (not shown) for connection between the circuit and a power source (not shown) is turned on and a capacitor C3 of the oscillator 4, is not charged no voltage is applied to the base of the transistor Tr23 which forms the differential amplifier. During this condition, that is, when the base voltage Vb1 of the transistor Tr23 is zero, the transistor Tr23 is non-conductive while the collector voltage thereof is high and, therefore, a transistor Tr24 is non-conductive. Likewisely, the transistors Tr21 and Tr25 have not yet been switched on and, accordingly, a transistor Tr28 is conductive. The switching transistor Tr26 for generation of sawtooth voltage is at this time non-conductive.

During a period in which the transistor Tr21 is non-conductive, the base voltage Vb2 applied to the base of the transistor Tr22 is represented by the following equation:

$$Vb^2 = \frac{r22 + r23}{r21 + r22 + r23} E1 \qquad (2)$$

wherein r21, r23 and r24 are resistances of the resistors R21, R22 and R23, respectively and E1 is the D-C power source voltage.

Subsequent switching on of the main switch permits the D-C power source voltage E1 to charge the capacitor C3 through the oscillation frequency adjusting resistor VR in such a manner as shown in FIG. 5(b). When the base voltage Vb1 of the transistor Tr23 starts to exceed the base voltage Vb2 of the transistor Tr22 at the time t1 a predetermined time after the capacitor C3 has been charged, the transistors Tr23 and Tr22 are respectively triggered on and off. Upon conduction of the transistor Tr23, the transistors Tr21 and Tr25 start conducting. Conduction of the transistor Tr25 results in reduction of the collector voltage thereof and, therefore, the transistor Tr28 is triggered off.

As the transistor Tr28 becomes non-conductive, the collector voltage of the transistor Tr28 increases, thereby triggering the transistor Tr26 on so that the charge on the capacitor C3 is discharged through the collector-emitter of the transistor Tr26. At this time, the collector current of the transistor Tr26 (i.e., the current flowing through the capacitor C3) is made to be constant by a constant current circuit which is composed of the transistor Tr27 and a diode D1. During this condition, the transistor Tr21 is conductive and, therefore, the base voltage Vb2 of the transistor Tr22 is lowered as represented by the following equation:

$$Vb^2 = \frac{r22}{r21 + r22} \cdot E1 \qquad (3)$$

Figure 13:
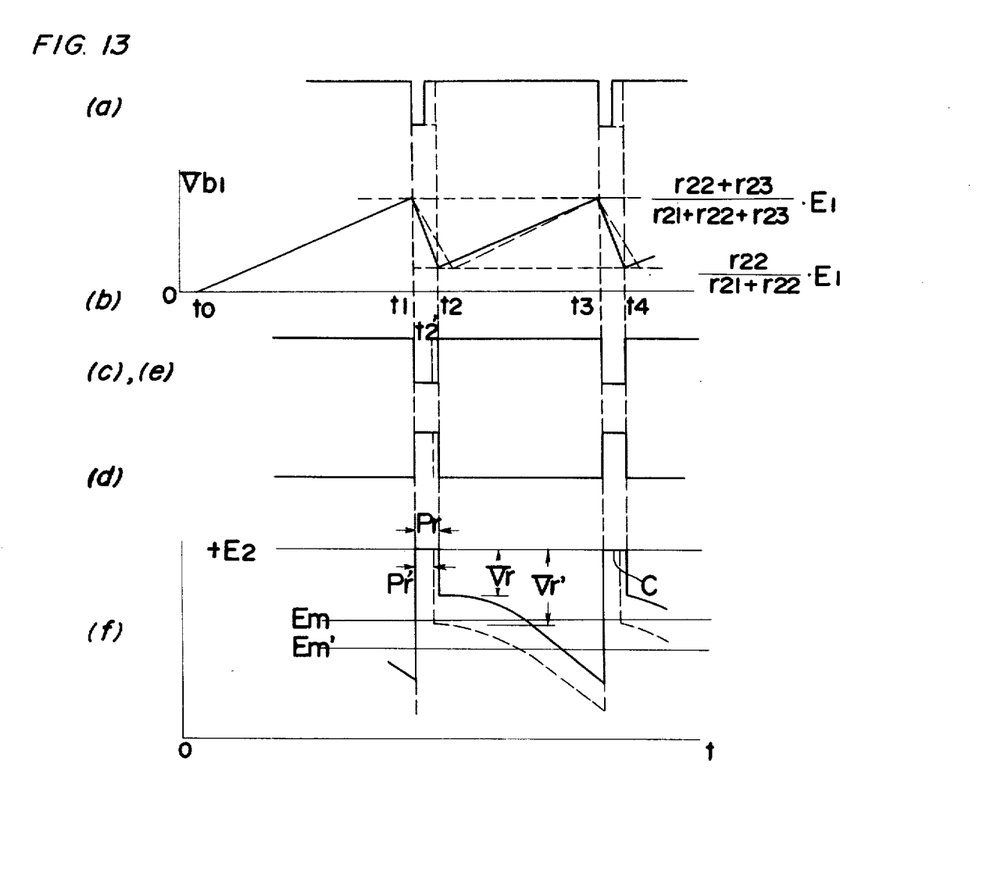
FIG. 13 is a diagram showing waveforms of various signals obtainable at various portions of the circuit of FIG. 12.

Accodingly, discharge of the potential stored in the capacitor C3 continues at a constant current determined by the base potential of the transistor Tr27 until the base voltage Vb1 of the transistor Tr23 becomes equal to the base voltage $$Vb^2 = \frac{r22}{r21+r22} \cdot E1$$

of the transistor Tr22 at the time t2. Thereafter, the transistor Tr23 is again triggered off while the transistor Tr22 is triggered on and this operation is repeated. The result is such that pulses of a rectangular waveform as shown in FIG. 13(e) are generated through the collector J9 of the transistor Tr25. The waveform of output pulse apearing at the output terminal T1 of the integrator 2 is as shown in FIG. 13(a) and this vertical synchronizing pulse is applied to the base of the transistor Tr21 whereby the oscillator 4 is oscillated in synchronizm with said vertical synchronizing pulses.

Waveforms of signals at the junctions J7, J8 and J6 are shown in FIGS. 13(c), (d) and (f), respectively.

On the other hand, though the start time t1 (FIG. 13(e)) of the output pulse from the oscillator 4 can be accurately determined because of synchronization with the vertical synchronizing pulse from the integrator 2, the termination t2 thereof cannot be accurately determined by the reason as hereinbefore described. If the pulse width of the output pulse from the oscillator 4 varies to represent a pulse width between t1 and t2' short of the required pulse width and the output pulse having such a reduced width is applied to the sawtooth signal generator 5 from the oscillator 4 the flyback pulse width Pr of the vertical deflection output at the junction J6 of the vertical output stage 8 is consequently reduced to a value Pr' as shown by the broken line in FIG. 13(f). The result is that the voltage Vr of the flyback pulse increases to represent a value Vr' by the reason as hereinbefore described in connection with the equation (1).

A voltage proportional to the average level Vm of D-C output voltage is extracted from a smoothing circuit 11, which is composed of the resistor R9 and a capacitor C4, and is subsequently fed to a transistor Tr29 for D-C amplification and phase-reversion. The transistor Tr29, upon receipt of this voltage from the smoothening circuit 11, generates voltage from the collector thereof which is used as a pulse width control voltage Ec which is subsequently applied to the base of the transistor Tr27. It is to be noted that the control voltage Ec increases in response to reduction of the flyback pulse width and, accordingly, the emitter-collector current of the transistor Tr27 is lowered upon receipt of the increased control voltage Ec' and the collector current of the transistor Tr26 is also lowered.

As a result thereof, the speed at which the capacitor C3 charges is retarded as indicated by the broken line in FIG. 13(b), thus broadening the pulse width of the output pulse from the oscillator 4. In this way, the oscillation of the oscillator 4 is controlled to render the flyback pulse Pr' to become the required flyback pulse Pr.

It should be noted that, if the speed at which the capacitor C3 charges is varied by controlling the collector current of the switching transistor Tr26, the repetition frequency of the output pulse produced in the oscillator 4 may vary which is negligible in practice.

From the foregoing full description of the present invention, it has now become clear that the arrangement of the present invention is very advantageous in that the pulse width of the flyback pulse can be effectively stabilized. However, it should be noted that various changes and modifications are apparent to those skilled in the art without departing from the true scope of the present invention and therefore, such changes and modifications should be, unless otherwise they depart therefrom, construed as included within the scope of the present invention.

What is claimed is:

1. A transformerless output vertical deflection circuit, comprising a vertical oscillator circuit for generating a vertical pulse train in response to vertical synchronizing pulses applied thereto, a sawtooth signal generator for generating a series of sawtooth signals, each cycle of said sawtooth signal including a pulse component, a vertical output circuit coupled to said sawtooth generator for amplifying said sawtooth signal including said pulse component and loading a vertical deflection coil, and stabilizing means connected between said vertical oscillator and said sawtooth signal generator for varying the width of the pulse component which is to be fed to said vertical output circuit in response to the average level of DC output voltage fed from the vertical output circuit.

2. A transformerless output vertical deflection circuit claimed in claim 1, wherein said stabilizing means comprises a control circuit means for receiving a series of pulses from the vertical oscillator and a feedback signal from the vertical output circuit and for varying the width of the pulse which is to be fed to the vertical output circuit in response to a DC control signal proportional to the width of the pulse component included in the vertical output signal and smoothing circuit means connected between said vertical output circuit and said stabalizing means for smoothing said feedback signal.

3. A transformerless output vertical deflection circuit claimed in claim 2, wherein said control circuit comprises a charging capacitor which is parallel to a transistor, said transistor being switched on in response to pulses fed from the vertical oscillator wherein said capacitor is charged by the voltage fed from said smoothing circuit, and discharged in response to conduction of the transistor, a differential amplifier circuit which receives the voltage on said capacitor and a fixed voltage, and a gating circuit for producing a pulse which has a width equal to the difference between the width of the pulse fed from the vertical oscillator circuit and the width of pulse fed from the differential amplifier circuit.

4. A transformerless output vertical deflection circuit claimed in claim 2, wherein said control circuit comprises a capacitor which is charged by a fixed power source and is discharged by means of a switching transistor operated by the pulses fed from the vertical oscillator circuit and a differential amplifier circuit receiving the voltage on the capacitor and the output of said smoothing circuit.

5. A transformable output vertical deflection circuit comprising a vertical oscillator for generating a vertical pulse train in response to vertical synchronizing pulses applied thereto, a sawtooth signal generator for generating a series of sawtooth signals each cycle of said sawtooth signal including a pulse component, a vertical output circuit for amplifying said sawtooth signal including said pulse component and loading a vertical deflection coil, and pulse stabilizing means coupled between the vertical oscillator circuit and the sawtooth signal generator, said stabilizing means comprising a capacitor which is charged by a fixed power source and discharged by means of a discharging means operated in response to the vertical pulse fed from the vertical oscillator, a circuit means for generating a train of output pulses each starting at the time when the voltage appearing on the capacitor exceeds a predetermined value and terminating in synchronism with termination of the pulse fed from the vertical oscillator, and gating means for generating pulses having a width equal to the difference between the width of the pulse fed from the vertical oscillator and the width of the output pulse of the circuit means.

6. A transformerless output vertical deflection circuit, comprising a vertical oscillator circuit for generating a vertical pulse train in response to vertical synchronizing pulses applied thereto, a sawtooth signal generator for generating a series of sawtooth signals, each cycle of said sawtooth signal including a pulse component, a vertical output circuit coupled to said sawtooth generator for amplifying said sawtooth signal including said pulse component and loading a vertical deflection coil, and stabilizing means, comprising a control circuit connected between said vertical output circuit and said vertical oscillator circuit for varying the width of each pulse produced by the vertical oscillator circuit in response to a DC control signal having a value corresponding to the width of the pulse component applied to the vertical deflection coil of the vertical output circuit for controlling the pulse width of the output of said vertical oscillator circuit and thereby the pulse width of said pulse component.

* * * * *